(12) United States Patent
Giuntoni et al.

(10) Patent No.: US 11,955,773 B2
(45) Date of Patent: Apr. 9, 2024

(54) LASER DEVICE ON THE BASIS OF A PHOTONIC CRYSTAL HAVING PILLAR-SHAPED OR WALL-SHAPED SEMICONDUCTOR ELEMENTS, AND METHODS FOR THE OPERATION AND PRODUCTION THEREOF

(71) Applicant: Forschungsverbund Berlin e.V., Berlin (DE)

(72) Inventors: Ivano Giuntoni, Berlin (DE); Lutz Geelhaar, Berlin (DE)

(73) Assignee: Forschungsverbund Berlin e.V., Berlin (DE)

( * ) Notice: Subject to any disclaimer, the term of this patent is extended or adjusted under 35 U.S.C. 154(b) by 796 days.

(21) Appl. No.: 16/467,719

(22) PCT Filed: Dec. 13, 2017

(86) PCT No.: PCT/EP2017/082530
§ 371 (c)(1),
(2) Date: Jun. 7, 2019

(87) PCT Pub. No.: WO2018/108970
PCT Pub. Date: Jun. 21, 2018

(65) Prior Publication Data
US 2020/0091682 A1    Mar. 19, 2020

(30) Foreign Application Priority Data

Dec. 14, 2016   (DE) .................. 102016014939.6

(51) Int. Cl.
*H01S 5/11*     (2021.01)
*H01S 5/02*     (2006.01)
(Continued)

(52) U.S. Cl.
CPC .............. *H01S 5/11* (2021.01); *H01S 5/021* (2013.01); *H01S 5/041* (2013.01); *H01S 5/1021* (2013.01);
(Continued)

(58) Field of Classification Search
CPC . H01S 5/11; H01S 5/021; H01S 5/041; H01S 5/1021; H01S 5/1028;
(Continued)

(56) References Cited

U.S. PATENT DOCUMENTS 6,566,155 B1 *   5/2003   Numai ................. G01C 19/721
                                                               438/31
9,184,235 B2    11/2015   Brandt et al.
(Continued)

FOREIGN PATENT DOCUMENTS

DE    102011118273 A1    5/2013
EP        1804350 A1     7/2007
(Continued)

OTHER PUBLICATIONS

"Light coupling between vertical III-Vs nanowires and planar Si photonic waveguides for the monolithic integration of active optoelectronic devices on a Si platform" Giuntoni et al. Optics Express Aug. 8, 2016 (Year: 2016).*
(Continued)

*Primary Examiner* — M. A. Golub-Miller
(74) *Attorney, Agent, or Firm* — Caesar Rivise, PC (57) ABSTRACT

The invention relates to a laser device (100) comprising a substrate (10), on the surface of which an optical waveguide (11) is arranged, which has an optical resonator (12, 13) with such a resonator length that at least one resonator mode forms a stationary wave in the resonator (12, 13), and an amplification medium that is arranged on a surface of the optical waveguide (11), wherein the amplification medium
(Continued)

comprises a photonic crystal (20) having a plurality of column- and/or wall-shaped semiconductor elements (21) which are arranged periodically on the surface of the optical waveguide (11) while protruding from the optical waveguide (11), and wherein the photonic crystal (20) is designed to optically interact with the at least one resonator mode of the optical resonator (12, 13) and to amplify light having a wavelength of the at least one resonator mode of the optical resonator (12, 13). The invention also relates to methods for the operation and production of the laser device.

16 Claims, 5 Drawing Sheets

(51) Int. Cl.
   *H01S 5/04*      (2006.01)
   *H01S 5/10*      (2021.01)
   *H01S 5/125*     (2006.01)
   *H01S 5/34*      (2006.01)
   *H01S 5/343*     (2006.01)

(52) U.S. Cl.
   CPC .......... *H01S 5/1028* (2013.01); *H01S 5/1042* (2013.01); *H01S 5/1071* (2013.01); *H01S 5/125* (2013.01); *H01S 5/341* (2013.01); *H01S 5/3412* (2013.01); *H01S 5/343* (2013.01); H01S 5/0208 (2013.01); H01S 5/101 (2013.01); H01S 2304/00 (2013.01)

(58) Field of Classification Search
   CPC ...... H01S 5/1042; H01S 5/1071; H01S 5/125; H01S 5/341; H01S 5/3412; H01S 5/343; H01S 5/0208; H01S 5/04252; H01S 5/101; H01S 2304/00
   See application file for complete search history.

(56) References Cited

U.S. PATENT DOCUMENTS

| | | | | |
|---|---|---|---|---|
| 10,770,861 | B1* | 9/2020 | Osinski | H01S 5/041 |
| 2006/0146409 | A1* | 7/2006 | Yanson | B82Y 20/00 359/566 |
| 2007/0153864 | A1* | 7/2007 | Lidorikis | H01S 5/18 372/108 |
| 2007/0252132 | A1 | 11/2007 | Kamins et al. | |
| 2009/0074026 | A1 | 3/2009 | Nagatomo et al. | |
| 2011/0081109 | A1 | 4/2011 | Thylen et al. | |
| 2012/0121221 | A1 | 5/2012 | Hakuta et al. | |
| 2013/0003768 | A1* | 1/2013 | Noda | H01S 5/11 372/41 |
| 2014/0226691 | A1 | 8/2014 | Kim et al. | |
| 2014/0286367 | A1 | 9/2014 | Scofield et al. | |
| 2020/0119524 | A1* | 4/2020 | Segev | H01S 5/1021 |
| 2020/0176943 | A1* | 6/2020 | Kante | H01S 5/1071 |
| 2022/0173574 | A1* | 6/2022 | Kante | H04J 14/04 |

FOREIGN PATENT DOCUMENTS

| | | |
|---|---|---|
| JP | 2002141603 A | 5/2002 |
| WO | 2015080666 A1 | 6/2015 |
| WO | 2017041812 A1 | 3/2017 |

OTHER PUBLICATIONS

"Efficient adjustable light couplers of integrated III-V nanowire emitters on silicon waveguides based on ring resonators" Aghaeipour et al., Optics Letters Sep. 1, 2020 (Year: 2020).*
Chen et al. (2011). Nanolasers grown on silicon. Nature Photonics, 5, 170-175.
Duan et al. (2014). Hybrid III-V on silicon lasers for photonic integrated circuits on silicon. IEEE Journal of Selected Topics in Quantum Electronics, 20(4), 6100213.
Giuntoni et al. (2015). Light coupling between vertical monolithically integrated III-V nanowires and planar silicon waveguides. Abstracts of European Materials Research Society Fall Meeting.
Jang et al. (2016). A hybrid silicon evanescent quantum dot laser. Applied Physics Express 9, 092102-1-092102-4.
Kim et al. (2016). Monolithically integrated InGaAs nanowires on 3D structured silicon-on-insulator as a new platform for full optical links. Nano Letters, 16, 1833-1839.
Korn et al. (2016). Lasing in silicon-organic hybrid waveguides. Nature Communications, 1-9.
Lee et al. (2016). Nanopillar array band-edge laser cavities on silicon-on-insulator for monolithic integrated light sources. Applied Physics Letters, 108, 081108-1-081108-4.
Scofield et al. (2011). Bottom-up photonic crystal lasers. Nano Letters, 11, 5387-5390.
Snyder et al. (2013). Hybrid integration of the wavelength-tunable laser with a silicon photonic integrated circuit. Journal of Lightwave Technology, 31(24), 3934-3942.
Stettner et al. (2016). Coaxial GaAs—AlGaAs core-multishell nanowire lasers with epitaxial gain control. Applied Physics Letters, 108, 011108-1, 011108-5.
Van Campenhout et al. (2007). Electrically pumped InP-based microdisk lasers integrated with a nanophotonic silicon-on-insulator waveguide circuit. Optics Express, 15(11), 6744-6749.

* cited by examiner

LASER DEVICE ON THE BASIS OF A PHOTONIC CRYSTAL HAVING PILLAR-SHAPED OR WALL-SHAPED SEMICONDUCTOR ELEMENTS, AND METHODS FOR THE OPERATION AND PRODUCTION THEREOF

CROSS-REFERENCE TO RELATED APPLICATIONS

This application is a U.S. National Phase Application of PCT/2017/082530, filed Dec. 13, 2017, which claims priority from DE 102016014939.6, filed Dec. 14, 2016, the contents of which applications are incorporated herein by reference in their entireties for all purposes.

BACKGROUND OF THE INVENTION

The invention relates to a laser device comprising a photonic crystal having a plurality of pillar-shaped and/or wall-shaped semiconductor elements (nanostructured semiconductor elements, in particular nanowires and/or nanowalls), and to methods for operating and producing thereof. Applications of the invention lie in generating coherent light, in particular in optoelectronics.

In order to explain the background of the invention, reference is made in particular to the following publications:
[1] J. Van Campenhout et al. in "Opt. Express" 15, 6744-6749 (2007);
[2] G.-H. Duan et al. in "IEEE J. Sel. Top. Quantum Electron." 20, 6100213 (2014);
[3] B. Snyder et al. in "J. Lightw. Technol." 3, 3934-3942 (2013);
[4] DE 10 2011 118 273 A1;
[5] R. Chen et al. in "Nat. Phot." 5, 170-175 (2011);
[6] T. Stettner et al. in "Appl. Phys. Lett." 108, 011108 (2016);
[7] A. C. Scofield et al. in "Nano Lett." 11, 5387-5390 (2011);
[8] US 2014/286367 A1;
[9] H. Kim et al. in "Nano Lett." 16, 1833 (2016);
[10] W.-J. Lee et al. in "Appl. Phys. Lett." 108, 081108 (2016);
[11] I. Giuntoni et al., Light coupling between vertical monolithically integrated III-V nanowires and planar silicon waveguides", Abstracts of "European Materials Research Society Fall Meeting", 2015;
[12] US 2014/226691 A1;
[13] D. Korn et al. in "Nature Communications" 7, 10864 (2016);
[14] B. Jang et al. in "Appl. Phys. Expr." 9, 092102 (2016);
[15] US 2012/0121221 A1; and
[16] US 2011/0081109 A1.

The monolithic integration of laser sources on silicon substrates constitutes one of the most important steps for new applications of silicon (Si) in photonics and/or electronics such as, for instance, integration of optical components or optical data transmission in conjunction with CMOS technology. Silicon has an indirect bandgap, which means that light emission cannot be achieved directly from silicon. Hence it is necessary to combine with other materials that have a direct bandgap of suitable energy. Silicon substrates in particular allow the integration of waveguides for guiding light between optical components.

Various methods have been proposed for integrating laser sources on silicon, for instance methods such as bonding III-V semiconductor chips on the surface of an Si waveguide [1, 2] or hybrid integration by connecting components that have been prefabricated separately [3]. These strategies have disadvantages, however, relating to limited efficiency of the light coupling into the waveguide, a complex structure or unsuitability for mass fabrication.

It is also known to produce light emitting components from photonic crystals (periodic arrangements of nanostructured semiconductor elements) (for instance see [7]). The semiconductor elements have characteristic dimensions in the sub-micrometer range. By selective etching of planar semiconductors ("top-down" process) or by epitaxial growth of nanostructured semiconductor elements on a substrate ("bottom-up" process), it is possible to form, for example, pillar-shaped semiconductor elements (nanowires, nanopillars) or wall-shaped semiconductor elements (nanowalls, nanoplates, nanosheets) on the substrate (see e.g. [4] and the publications cited therein). Of interest in particular are those semiconductor elements having heterostructures made of compound semiconductors based on arsenides and phosphides of group-III atoms (group III-arsenide or group III-phosphide semiconductors), which have direct bandgaps smaller than the bandgap of Si and therefore are suitable for emitting light, which can be guided in Si waveguides without large losses.

Nanostructured semiconductor elements made of compound semiconductors have the advantage, especially when fabricated using the "bottom-up" process, that it is possible to overcome limitations in planar technology arising from the lattice misalignment with respect to Si substrates. Base surfaces of the nanostructured semiconductor elements having typical dimensions of less than several hundred nanometers allow compound semiconductors to be grown on Si substrates in better crystal quality than is possible by planar means.

Laser sources having an amplification medium formed by a single nanowire or a periodic arrangement of nanowires are described for example in [5, 6, 7, 8]. These laser sources, however, are characterized by a limited power performance and limited potential uses in practice. For instance, they are not designed to be combined with other optical components.

Positioning III-V semiconductor nanowires on the surface of a structured Si substrate, and coupling light between the nanowires and an Si waveguide is described in [9, 10]. In these arrangements, the Si on which the nanowires are positioned is used solely as a mechanical support. Furthermore, emission of coherent laser light is not achieved by the structures described in [9, 10]. [11] describes the coupling of light fields between a periodic arrangement of vertical semiconductor nanowires and planar Si waveguides. It is also possible to achieve coupling of light fields between a planar Si waveguide and a semiconductor structure located thereabove when the latter is constructed as a photonic crystal by etching holes out of a semiconductor block [12].

[13] describes a laser source that comprises a hybrid structure having a waveguide resonator made of silicon and a cover layer made of a dye-doped organic substance. The cover layer forms an amplification medium for the light being guided in the waveguide resonator. The hybrid structure described in [13] has disadvantages arising from limited efficiency of the light coupling between amplification medium and resonator, so that it is required that the resonator has a large length, and arising from a limited capability for electrical excitation (electrical pumping) of the organic cover layer.

[14] describes a laser source that comprises a hybrid structure having a waveguide resonator made of silicon and an amplification medium placed thereon. The latter consists of an ensemble of quantum dots embedded epitaxially in a compound semiconductor heterostructure. This hybrid structure has disadvantages arising from the small volume of the quantum dots, which act separately from one another and do not form a photonic crystal, so that it is required that the resonator has a large length. Another disadvantage of the laser source arises from it not being produced monolithically.

[15] describes a light emitting device of similar design to that in [14] having an ensemble of quantum dots on a waveguide in the form of an optical fiber. Unlike in [14], however, the quantum dots are not intended for laser operation but for spontaneous emission, for instance in order to provide a single-photon emitter. The light emitted by the quantum dots is coupled out into a fiber resonator in the optical fiber. In order to optimize the coupling, the entire ensemble of quantum dots is positioned at a maximum of the field in the fiber resonator.

[16] describes a waveguide in the form of a nanopillar array. Unlike in a photonic crystal, it is only near-field coupling that occurs between neighboring nanopillars in the nanopillar array. Light amplification takes place only in the individual nanopillars, without any external resonator being provided on the waveguide described in [16].

The objective of the invention is to provide an improved laser device based on a photonic crystal having a plurality of nanostructured semiconductor elements, which laser device overcomes disadvantages of conventional techniques. In particular, the laser device shall be characterized by a higher power performance, a suitability for miniaturization, a capability for electrical excitation of the laser emission, and/or an improved suitability for integration in Si-based semiconductor devices, in particular Si-based photonics and large-scale integrated electronics. It is also the objective of the invention to provide improved methods for operation and improved methods for producing such a laser device, which methods avoid disadvantages of conventional methods.

These objectives are achieved by the laser device and the operation and producing methods of the invention.

SUMMARY OF THE INVENTION

According to a first general aspect of the invention, the aforementioned objective is achieved by a laser device comprising an optical waveguide and an amplification medium. The optical waveguide includes an optical resonator of resonator length that is suitable for guiding at least one resonator mode in the resonator. The amplification medium is arranged on the surface of the optical waveguide.

According to the invention, the amplification medium comprises a photonic crystal having a plurality of pillar-shaped and/or wall-shaped semiconductor elements, which are arranged in a periodic manner, protruding from the optical waveguide, on the surface of the optical waveguide. The surface of the optical waveguide is an unstructured, in particular plane, surface, which directly forms a boundary of the optical waveguide.

In addition, according to the invention, the photonic crystal is configured by selecting the geometric properties thereof to interact optically directly with the at least one resonator mode of the optical resonator. The inventors have found that by selecting the geometric properties, in particular the periods (spacings), the diameter and the height of the semiconductor elements, the photonic crystal can be formed such that the coupling between the photonic crystal and the optical waveguide (and vice versa) is maximized. The photonic crystal as an amplification medium advantageously becomes part of the optical resonator. According to the invention, in particular in contrast with [14], [15], and [16], the light is coupled back and forth between the nanowires of the photonic crystal and the waveguide in a bidirectional manner.

For the function of the laser device, it is sufficient if just a segment of the waveguide is configured as the optical resonator. Another significant advantage of the invention, however, is that the waveguide containing the optical resonator can be coupled directly to a waveguide outside the laser device and/or, for instance in the case of a linear resonator, extends outside the optical resonator.

Unlike the technologies described in [9, 10], in which a photonic crystal composed of nanowires interacts optically in an evanescent manner only with a waveguide provided on the sides, according to the invention the photonic crystal is coupled directly to a waveguide lying immediately thereebeneath. This advantageously avoids the limitations arising in [9, 10] from the less efficient optical coupling and from providing the lattice structure on which the nanowires are grown.

The inventors have also found that the hybrid structure given in [13] and [14] has disadvantages arising from the separation of amplification in the cover layer from light-guiding in the waveguide. In the case of the hybrid structure described in [13], light is coupled out of the waveguide resonator into the cover layer solely in an evanescent manner, with the result that the intensity simply decreases in the amplification medium in a direction away from the waveguide, and the coupling is determined solely by the geometry of the waveguide resonator and the refractive index of the cover layer. In contrast, according to the invention, the coupling of the photonic crystal to the resonator is determined on the basis of diffraction, in particular by the period of the semiconductor elements in a reference direction along the orientation of the light field in the waveguide, in particular parallel to the optical axis in the waveguide, and by the diameter and refractive index of said semiconductor elements. Standing light waves in the optical resonator of the waveguide extend onto the photonic crystal. This type of coupling is advantageously significantly more efficient than evanescent coupling, which means that the laser device can have a significantly more compact design.

According to the invention, light is also guided inside the photonic crystal under the action of a step change in the refractive index relative to the surroundings of the semiconductor elements and/or additionally by means of metal mirrors on the photonic crystal. Since the interaction according to [13] is just evanescent and therefore weak, with conventional technology the resonator must be relatively long (at least a few mm), resulting in numerous resonator modes and a very wide wavelength spectrum, which means that in [13] there is limited suitability for setting specific output wavelengths and for miniaturization for optoelectronic applications.

The waveguide containing the optical resonator is preferably arranged on a substrate. The substrate advantageously acts as a mechanical support. Particularly preferably, the waveguide is produced by processing on the substrate.

The optical waveguide is preferably formed such that it protrudes above the surface of the substrate. The waveguide has lateral surfaces, which are oriented perpendicular to, or inclined relative to, the surface of the substrate, and has a top surface, which is oriented parallel to the surface of the substrate. According to a preferred embodiment of the invention, the photonic crystal is arranged on the top surface of the optical waveguide, with the semiconductor elements oriented perpendicular to the top surface and to the surface of the substrate. Particularly preferably, the photonic crystal is arranged exclusively on the top surface of the optical waveguide, while the lateral surfaces are free of semiconductor elements. [13] describes covering all sides of the waveguide with the amplification medium because of the light field escaping from the waveguide mainly through the lateral surfaces into the cover layer. The inventors have found that by virtue of the significantly more efficient nature of the coupling, there is no need for the photonic crystal to cover the sides of the waveguide.

The inventors have also found that, on the one hand, the resonator length of the optical resonator, i.e. the length of the waveguide between the reflectors, defines a resonator wavelength, while, on the other hand, the periodicity of the arrangement of the semiconductor elements defines a coupling wavelength that is coupled between semiconductor elements and the waveguide. Preferably, both parameters are selected at the same time such that the resonator wavelength in the waveguide is matched to the coupling wavelength. This is done by arranging the semiconductor elements along the reference direction parallel to the optical axis in the waveguide preferably at the positions at which are located field maxima of the at least one resonator mode (standing wave in the waveguide). In other words, the period of the semiconductor elements is preferably a multiple of the wavelength in the waveguide. In particular in contrast with [14] and [15], the arrangement of the nanowires is thus preferably selected such that one nanowire is placed at the position of a field maximum.

The laser device can advantageously be provided with different types of resonators. For example, the resonator may be a linear resonator having two reflectors formed at the optical waveguide (first embodiment of the invention), or a closed resonator without reflectors (second embodiment of the invention).

The linear resonator is preferably in the form of an elongated cuboid, which is formed on the surface of the substrate of the laser device, in particular protruding therefrom. Particularly preferably, the reflectors comprise periodic structures in the waveguide, which form Bragg reflectors for the at least one resonator mode. The periodic structures in the waveguide comprise refractive-index variations, e.g. as a result of recesses in the top surface of the waveguide, which are spaced apart along the optical axis of the waveguide at distances for satisfying the Bragg condition for the at least one resonator mode.

According to a first variant of the first embodiment of the invention, it is sufficient for the semiconductor elements to be arranged on the top surface of the linear resonator as a single straight row along the reference direction parallel to the optical axis of the resonator. In this case, the semiconductor elements form a single-row linear photonic crystal, which advantageously is characterized by being easier to produce. According to an alternative variant of the first embodiment of the invention, at least two, preferably at least three, parallel rows of the semiconductor elements are arranged on the top surface of the linear resonator along the reference direction parallel to the optical axis of the resonator. In this case, the photonic crystal can be configured in particular such that optical coupling of a central row to the waveguide is stronger than the optical coupling of the outer rows to the waveguide, and the outer rows are adapted for lateral containment of the light field in the photonic crystal. This advantageously results in higher efficiency of the laser device.

The closed resonator of the second embodiment of the invention is provided with a coupling section for coupling light out of the closed resonator. The coupling section preferably comprises a linear waveguide, which runs at a separation along an outer face of the closed resonator, said separation being selected in dependency on the wavelength. Alternatively, the coupling section can consist of a multi-mode interference coupler.

Different forms of closed resonators are advantageously available that can be used to implement the laser device according to the second embodiment of the invention. For example, the closed resonator may be a ring resonator with a circle shape. This can have advantages for forming the at least one resonator mode in the resonator. The photonic crystal comprises a single-row or multi-row periodic circular arrangement of the semiconductor elements on the top surface of the ring resonator.

Alternatively, the closed resonator can be a racetrack resonator, the shape of which is composed of straight and curved segments, which can be advantageous by it being particularly preferred to arrange the photonic crystal on at least one of the straight segments. For this variant of the invention, the photonic crystal, as mentioned above with reference to the linear resonator, can comprise one or more (at least two, in particular at least three) straight rows of the semiconductor elements, which extend parallel to the optical axis in the corresponding straight segment of the waveguide.

According to a particularly preferred embodiment of the invention, the laser device is adapted for electrical excitation of the photonic crystal. The surface of the substrate carries preferably adjacent to the photonic crystal, in particular adjacent to the waveguide, a first contact electrode, which is adapted to connect bottom ends of the semiconductor elements, which are connected to the substrate, via the substrate to a voltage source device.

A second contact electrode is adapted to connect top ends of the semiconductor elements, which top ends are opposite the bottom ends, to the voltage source device. For this purpose, the semiconductor elements of the photonic crystal are preferably arranged in a dielectric embedding layer, which advantageously provides stability and mechanical protection to the semiconductor elements and forms a support for the second contact electrode.

Particularly preferably, the second contact electrode is formed by an electrical contact layer, which is arranged on the embedding layer and is electrically connected to the top ends of the semiconductor elements. If the electrical contact layer is an opaque layer, for instance is made of metal, this is also advantageous for the containment of the light field in the photonic crystal.

Alternatively, the laser device can be designed for optical excitation of the photonic crystal. In this case, no contact electrodes are provided.

According to another particularly preferred embodiment of the invention, the waveguide is made of silicon. The substrate is preferably a SOI substrate having a silicon support substrate, a silicon dioxide layer and a silicon cover layer, which includes the optical waveguide. The waveguide particularly preferably is etched from the silicon cover layer. The semiconductor elements are arranged in immediate contact with the silicon, resulting in a number of advantages. First, this simplifies the integration of the laser device according to the invention in a Si-based structure, in particular in a Si-based optoelectronic chip. Second, the silicon when doped is sufficiently electrically conductive to provide the electrical contact to the semiconductor elements at their bottom ends, which face the substrate. The substrate particularly preferably consists of silicon dioxide having a silicon cover layer, which forms the substrate surface and carries the semiconductor elements. The silicon dioxide advantageously has a particularly large bandgap and a low refractive index, with the result that the silicon dioxide assists in the containment of the light guided in the waveguide. Apart from the embodiment described here in detail, which is based on a waveguide made of silicon, embodiments are also conceivable, however, for which the waveguide consists of a different material, for instance a material such as InP, GaAs, GaN or AlN. Light of other wavelengths can be guided losslessly depending on the material of the waveguide, from which is found the advantageous materials for the substrate and the semiconductor elements in each case.

According to a second general aspect of the invention, the aforementioned objective is achieved by a method for operating the inventive laser device according to the first general aspect of the invention. During operation of the laser device, the laser device is coupled to a pump device, in particular to a voltage source device or a pump light source, the photonic crystal is electrically or optically excited, and laser light is guided in the waveguide and/or laser light is emitted from the waveguide. Laser light is advantageously coupled directly into the waveguide and thereby provided for photonic uses based on waveguides. Alternatively, the light can be guided out of the waveguide.

According to a third general aspect of the invention, the aforementioned objective is achieved by a method for producing a laser device according to the first general aspect of the invention. The semiconductor elements of the photonic crystal are grown on the substrate. Preferably, all the semiconductor elements grow simultaneously. Then contact is made to the photonic crystal by means of contact electrodes. Growing the semiconductor elements preferably comprises direct epitaxial growth or vapor-liquid-solid based growth of the semiconductor elements on the substrate, and/or mask-based deposition of the semiconductor elements on the substrate. Particularly preferably, the semiconductor elements are embedded in a transparent embedding layer.

BRIEF DESCRIPTION OF THE DRAWINGS

Further details and advantages of the invention are described below with reference to the accompanying drawings, in which.

DETAILED DESCRIPTION OF PREFERRED EMBODIMENTS

Embodiments of the invention are described below by way of example with reference to a laser device provided with a single row of semiconductor elements in the form of nanowires. Using a single-row photonic crystal is advantageous for easier production of the laser device. The practical implementation of the invention is not limited to this embodiment, however. In fact, the laser device can be realized using a multi-row photonic crystal. Furthermore, the invention is not limited to the use of nanowires but can be realized in a corresponding manner using a photonic crystal that is made of nanowires and nanowalls or solely of nanowalls. In these variants of the invention, the nanowalls are oriented transversely relative to the light path in the resonator, in particular transversely relative to the optical axis in the resonator.

In general, in the embodiments of the invention, the semiconductor elements of the photonic crystal include, for example, the form of a pillar (or pin, wire or rod) or the form of a wall (or plate). The thickness of the semiconductor elements preferably equals at least 1 nm and/or at most 500 nm, and the height of the semiconductor elements preferably equals at least 10 nm and/or at most 10 μm. The semiconductor elements are preferably produced from a III-V semiconductor, in particular GaAs, GaP or GaN compound semiconductors, and are optionally doped, for instance with Si, Be, C or Te (GaAs) or with Si, Ge or Mg (GaN).

Figure 1:
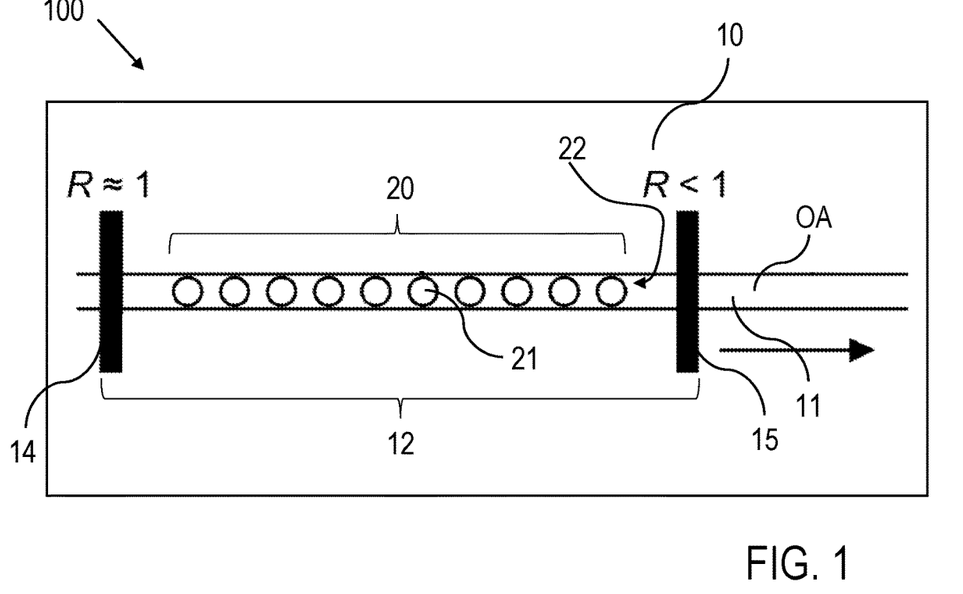
FIG. 1 shows in a schematic plan view a laser device having a linear resonator according to the first embodiment of the invention.

FIG. 1 shows in a schematic plan view the first embodiment of a laser device 100 according to the invention having a linear resonator 12. This laser device 100 comprises a substrate 10, protruding from the surface of which is formed a straight waveguide 11 (see FIG. 3). The waveguide 11 and the surface of the substrate 10 are made integrally from silicon, in particular as part of a silicon wafer.

The waveguide 11 is cuboid in shape and has lateral surfaces perpendicular to, or at an angle to, the surface of the substrate 10, and has a top surface parallel to the surface of the substrate 10. The waveguide 11 has a width of e.g. 500 nm and a height of the top surface relative to the rest of the surface of the substrate 10 of e.g. 50 nm. In the longitudinal direction, the waveguide 11 has a length that is selected in dependency on the specific use of the laser device 100, and can be selected in the range of 5 μm to 5 mm. If the laser device 100 is adapted for electrical excitation of the photonic crystal, then the substrate 10, and in particular the waveguide 11, comprises doped silicon. For instance, the silicon is doped with boron at a concentration of $10^{18}$ cm$^{-3}$. If the laser device 100 is adapted for optical excitation of the photonic crystal, non-doped silicon is preferably used.

The waveguide 11 has two reflectors 14, 15, which encompass the linear resonator 12. The linear resonator 12 has a length along the optical axis OA of e.g. 10.2 μm, which corresponds to a resonant wavelength of e.g. 1.3 μm. The length of the resonator is thus almost 1000 times smaller than in [13] and [14], thereby advantageously improving the suitability of the laser device 100 to be integrated in an optoelectronic integrated circuit (optoelectronic chip).

The reflectors 14, 15 have different reflectivities. The first reflector 14, as a resonator end mirror, has a reflectivity of almost or exactly 100%, for instance at least 99.9%, whereas the second reflector 15, as the reflector coupling-out mirror, has a lower reflectivity in the range of 95% to 98%. The reflectors 14, 15 are Bragg reflectors having Bragg structures in the material of the waveguide 11 (see FIG. 7). Alternatively, at least one of the reflectors 14, 15 can be a dielectric mirror on an end face of the waveguide 11.

The photonic crystal 20 comprises a straight row 22 of e.g. ten semiconductor elements 21, for instance elements such as cylindrical nanopillars 21, which are arranged on the top surface of the waveguide 11 at a period of e.g. 750 nm. This period is optimized for a coupling wavelength of e.g. 1.3 μm, which is matched to the aforementioned resonant wavelength. The nanopillars 21 are formed, for example, by epitaxial growth on the waveguide 11. Each nanopillar 21 advantageously includes, for instance, a heterostructure comprising at least one quantum well, quantum wire or quantum dot, which structure is made from e. g. compound semiconductors having different dopings. The totality of the nanopillars 21 of the photonic crystal 20 forms the amplification medium and thus together with the linear resonator 12 forms the entire resonator of the laser device 100 according to the invention. Under electrical or optical excitation of the photonic crystal 20 (see FIGS. 3, 4), emission and resonant amplification of light and coupling-out into the rest of the waveguide 11 or into an adjacent free space through the second reflector 15 (see arrow) take place.

Figure 2:
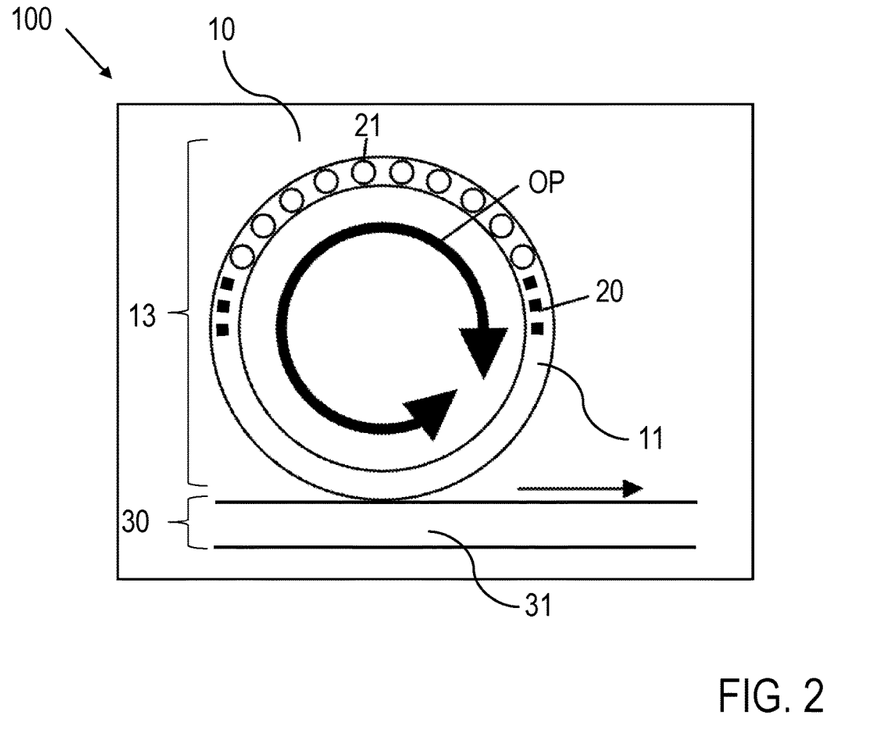
FIG. 2 shows in a schematic plan view a laser device having a ring resonator according to the second embodiment of the invention.

Alternatively, the laser device 100 according to the invention, in the second embodiment, can comprise the ring resonator 13 shown in schematic plan view in FIG. 2. The ring resonator 13 comprises a waveguide 11 in the shape of a circular ring having a rectangular cross-sectional area relative to the surface of the substrate 10. On the top surface of the waveguide 11, which has a diameter of e.g. 4 μm, is arranged the photonic crystal 20 in the form of a circular row of e.g. ten semiconductor elements 21, for instance cylindrical nanopillars 21. Under electrical or optical excitation of the photonic crystal 20, light is emitted and resonantly amplified, is guided along the circular optical path OP in the ring resonator 13 (symbolized by the double-ended arrow) and coupled out at a coupling section 30. The coupling section 30 contains a waveguide 31, which is arranged at a separation from the waveguide 11.

In order to couple light between the closed ring resonator 13 and the waveguide 31, it is sufficient to make a suitable choice for the lateral separation between the two. Alternatively, by suitable semiconductor processing, the coupling section 30 can be configured with a material bridge between the ring resonator 13 and the waveguide 31.

Manufacturing and characterizing the laser device 100 is described in the following with reference to the first embodiment (in which a linear resonator is used). The second embodiment of the laser device 100 (in which the ring resonator is used), is produced and characterized in a corresponding manner with an adaptation to the shape of the waveguide.

Figure 3:
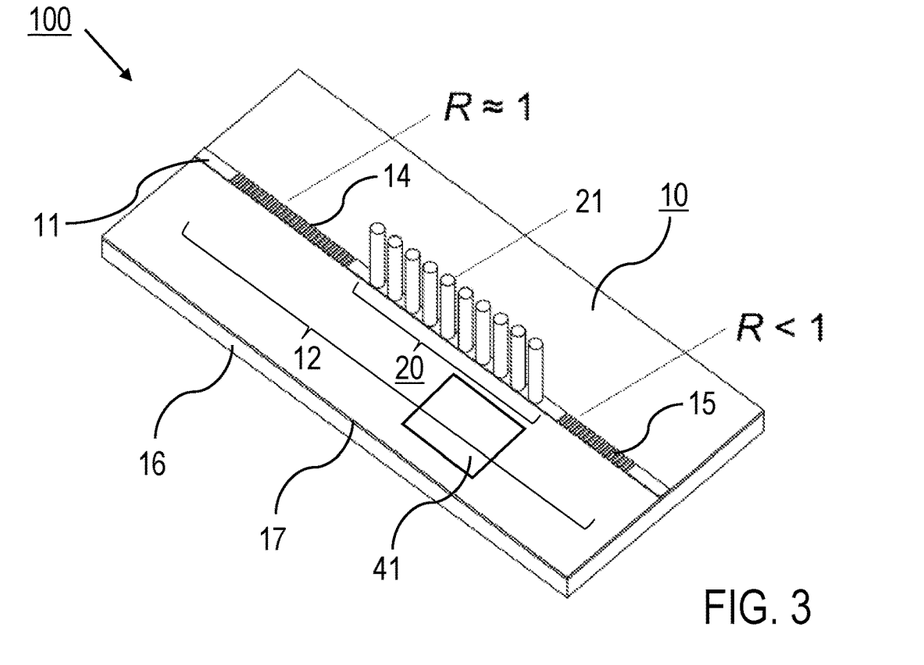
FIGS. 3 and 4 show in schematic perspective views a laser device having a linear resonator according to the first embodiment of the invention.
Figure 4:
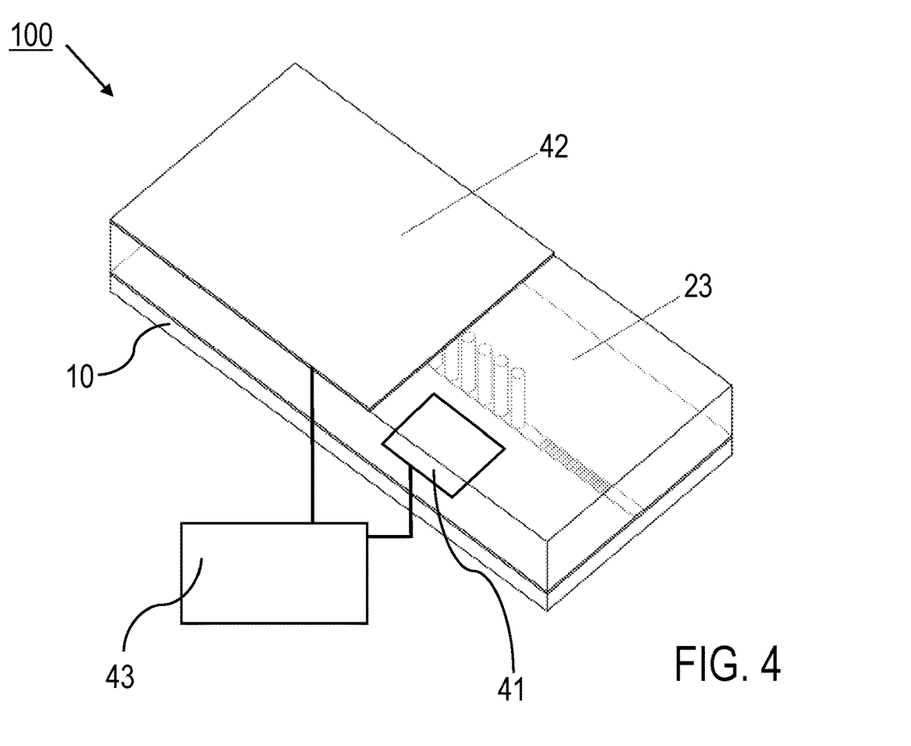

FIGS. 3 and 4 show different phases in the production of the laser device 100 according to the invention having the following features, for example. For laser emission at a wavelength of λ=1.3 μm, the waveguide 11 consists of silicon (optional doping: $10^8$ cm$^{-3}$), and the semiconductor elements 21 are nanowires made of group-III arsenides and/or group-III phosphides. For example, for a GaAs—(In, Ga)As—GaAs heterostructure, a p-n profile is formed in the semiconductor elements 21, preferably as a core-shell structure or alternatively in the longitudinal direction of the semiconductor elements 21, that allows electrical excitation of the photonic crystal and confinement of the charge carriers in the active sections of the semiconductor elements 21.

In a first step, the substrate 10 is provided with the optical waveguide 11. The substrate 10 has a layered construction composed of a silicon support substrate (not shown), a silicon dioxide support layer 16 and a silicon cover layer 17, on which is formed the waveguide 11. The silicon support substrate constitutes the mechanical support for the laser device 100, and advantageously can also contain electronic components. The thicknesses of the silicon dioxide support layer 16 and of the silicon cover layer 17 equal 2 μm and 220 nm, for example. The substrate 10 is produced by methods known per se for silicon processing, for instance methods such as ion implantation or wafer bonding. The reflectors 14, 15 are formed on the waveguide 11. Grooves, which form the Bragg structures, are introduced into the waveguide 11, for instance by etching. The number of grooves (number of periods) determines the reflectivity of the reflectors 14, 15. For example, the first reflector 14 (having a reflectivity of almost 100%) comprises 100 grooves at a spacing of 230 nm, whereas the second reflector 15 (having a reflectivity of 95%, for example) comprises 40 grooves at the same spacing.

In order to form the photonic crystal 20, the semiconductor elements 21 are deposited by epitaxial growth on the surface of the waveguide 11. This is done by forming a $SiO_2$ masking layer (not shown) on the top surface of the waveguide 11. The masking layer includes holes at which the waveguide is exposed and the growth of the semiconductor elements 21 takes place.

In addition, a first contact electrode 41 is deposited on the surface of the substrate 10, in particular on the silicon cover layer 17 beside the waveguide 11. The contact electrode 41 comprises, for example, a layer made of gold or aluminum for coupling via an electrical lead to a pump current source (power supply device) 43 (see FIG. 4).

The photonic crystal 20 is then embedded in an embedding layer 23, as shown in FIG. 4, which is preferably produced from an organic polymer, for instance Benzocyclobutene (BCB), by spin-coating. The embedding layer 23 is removed until the upper ends (top ends) of the semiconductor elements 21 are exposed.

Finally, a metal layer, for instance made of gold, is formed as the second contact electrode 42 on the surface of the embedding layer 23 and in electrical contact with the semiconductor elements 21. The second contact electrode 42 performs a dual function in terms of making the electrical contact (connection to the pump current source 43 acting as the pump device) and as a third reflector, which bounds the photonic crystal 20 in a direction perpendicular to the surface of the substrate 10. The second contact electrode 42 has a thickness of 100 nm, for example.

The laser device 100 shown in FIGS. 3 and 4 is provided for electrical excitation of laser emission by injecting a pump current from the pump current source 43 via the first and second contact electrodes 41, 42 into the photonic crystal 20. The implementation of the invention is not limited to electrical excitation of the photonic crystal 20, however, but optionally is possible using optical excitation of the photonic crystal 20. In this case, the first and second contact electrodes 41, 42 are not provided, and the substrate can be made from non-doped silicon. The optical excitation of the photonic crystal 20 is preferably performed using a pump light source (not shown, for instance a laser diode) by illumination through the embedding layer 23.

Figure 5:
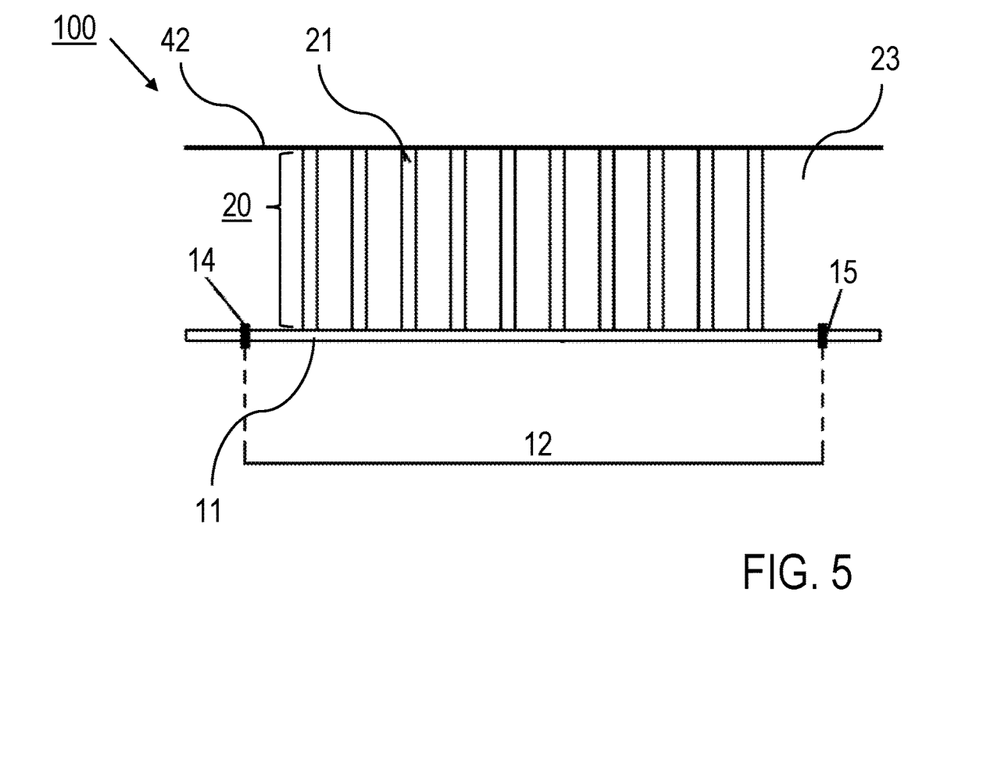
FIGS. 5 and 6 show a linear resonator in a schematic side view and a graph of the Q factor of the linear resonator as a function of the period of the semiconductor elements.

FIG. 5 shows a side view of the first embodiment of the laser device 100 according to the invention comprising the waveguide 11 (without the remaining substrate) and the photonic crystal 20. The linear resonator 12 is formed by the reflectors 14, 15 and by the section of the waveguide 11 that lies between these reflectors. The semiconductor elements 21 of the photonic crystal 20 are formed vertically upright on the surface of the waveguide 11 and are embedded in the embedding layer 23. On the top face of the embedding layer 23 is located the second contact electrode 42 in electrical contact with the top ends of the semiconductor elements 21.

Figure 6:
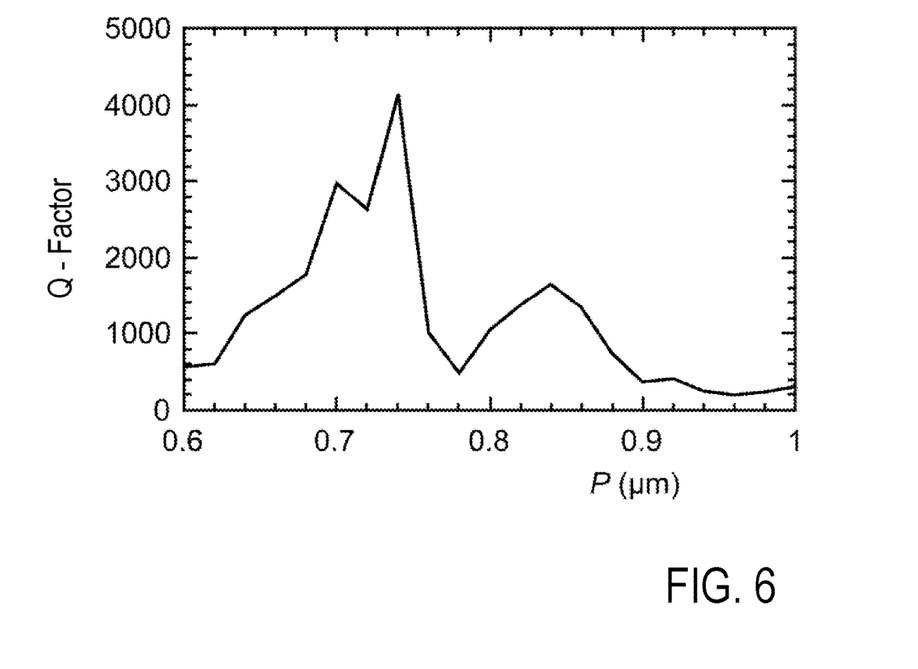

The two-dimensional numerical simulation of the quality factor (Q factor) of the linear resonator 12 using commercially available FDTD software (finite difference time domain software) provides the relationship shown in FIG. 6 between the Q factor and the period P of the photonic crystal 20. The Q factor is a dimensionless value that indicates the number of optical cycles after which the energy inside the linear resonator 12 drops by a factor of $\exp(-2\pi)$.

The simulation result shown in FIG. 6 is obtained using a photonic crystal 20 made of ten GaAs/(In, Ga)As nanowires 21 having p-n profile with core-shell geometry and two ideal reflectors 14, 15 (100% reflectivity for each) in a waveguide made of Si of height 220 nm and length 10.2 µm, for a height of the nanowires 21 of 3 µm, a diameter of the nanowires of 260 nm, and a thickness of the (In,Ga)As shell of 20 nm. A Q factor greater than 4000 is obtained at a period of P=0.75 µm.

Figure 7:
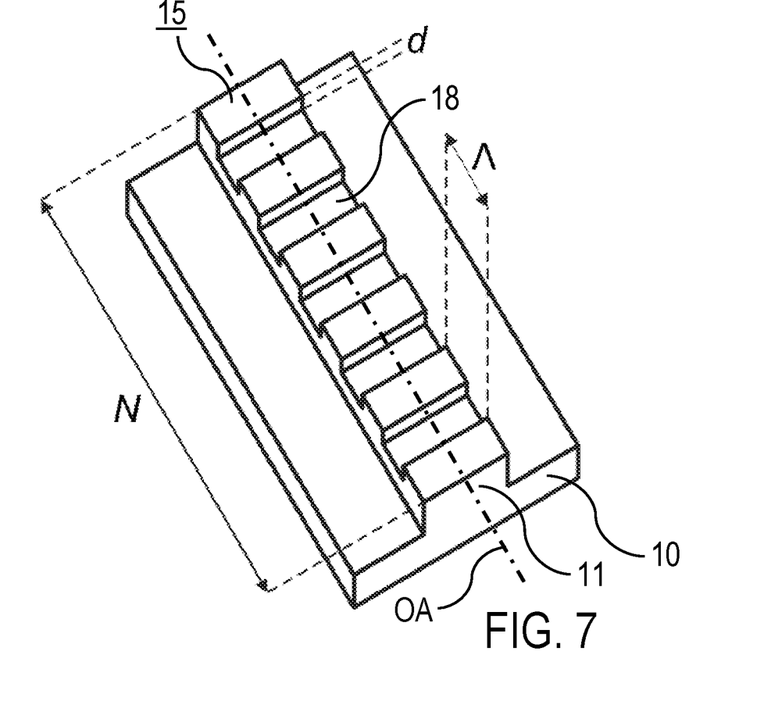
FIGS. 7 and 8 show a Bragg reflector of the linear resonator of FIG. 1 in a schematic perspective view and a graph of the reflectivity and transmissivity as a function of the number of periods of the Bragg reflector.
Figure 8:
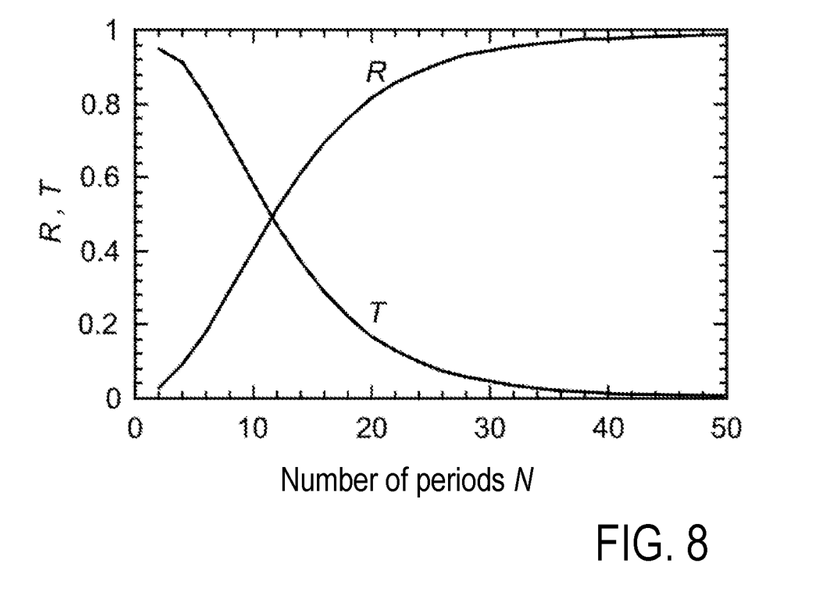

After determining the length of the resonator and selecting the period of the photonic crystal 20 on the basis of the maximum Q factor, the dimensions of the reflectors 14, 15, in particular of the Bragg structures in the waveguide 11 shown in FIGS. 7 and 8, are defined.

In general, the reflectivities of the resonator end mirror 14 and of the resonator coupling-out mirror 15 are preferably set by selecting the number of periods and the modulation depth of the Bragg structure. These parameters of the resonator end mirror 14 are selected, for instance on the basis of tests or simulations using the bidirectional mode propagation method (BEP method), so as to achieve a reflectivity of almost 1. The number of periods and the modulation depth of the coupling-out mirror 15 are selected in a corresponding manner and additionally according to the Q factor of the linear resonator 12, such that a predetermined proportion of the light circulating in the linear resonator 12 is coupled out through the resonator end mirror 15.

FIG. 7 illustrates in a schematic perspective view the Bragg structure of one of the reflectors 14, 15. The Bragg structure comprises a periodic arrangement of grooves 18 in the waveguide 11 on the substrate 10. The grooves 18 extend perpendicular to the longitudinal dimension (optical axis OA) of the waveguide 11. The spectral reflectivity of the Bragg structure is determined by the period A (distance between the grooves), the number of periods N (number of grooves) and the modulation depth (depth d of the grooves 18).

For the aforementioned example of silicon as the material of the waveguide and a wavelength of $\lambda=1.3$ µm, a period of $\lambda=227$ nm is selected in order to satisfy the Bragg condition. The depth d of the grooves 18 can extend over part of the height of the waveguide 11 relative to the surface of the substrate 10, or over the entire height of the waveguide 11. In the example mentioned, the depth d of the grooves 18 equals 50 nm.

The reflectivity and transmissivity of the Bragg structure can be adjusted by varying the number of periods N. The simulation result illustrated in FIG. 8, obtained using the BEP method, shows how the reflectivity R increases as the number of periods N increases, whereas the transmissivity T decreases as the number of periods N increases. A reflectivity of almost 1 is achieved for a Bragg structure having more than 50 grooves 18.

Figure 9:
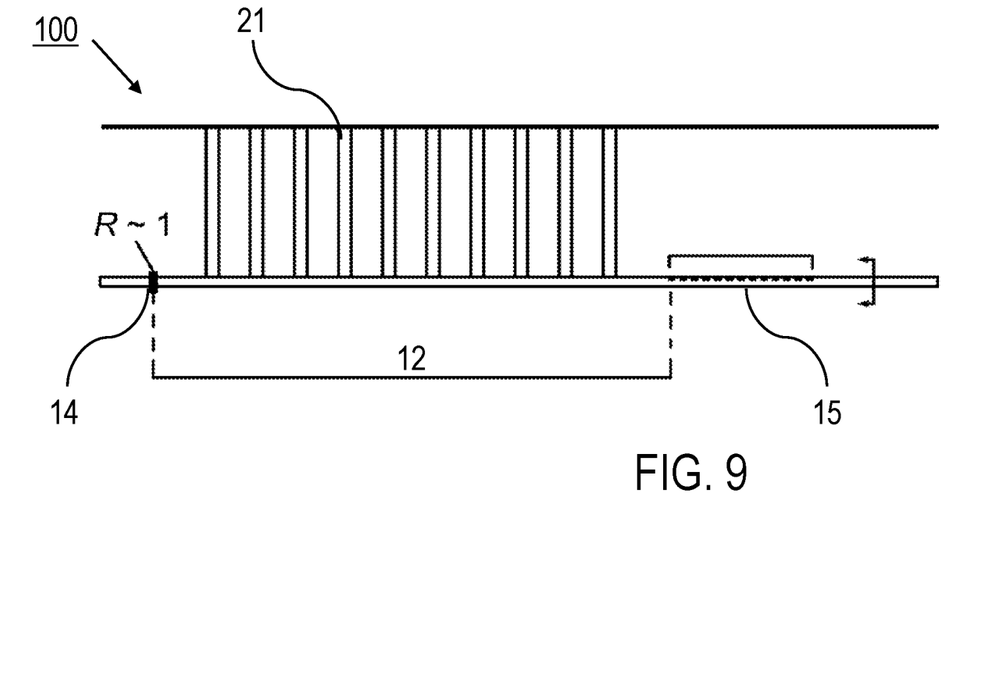
FIGS. 9 and 10 show a linear resonator in another schematic side view and a graph of the output power of the laser device as a function of the gain factor of the semiconductor elements.
Figure 10:
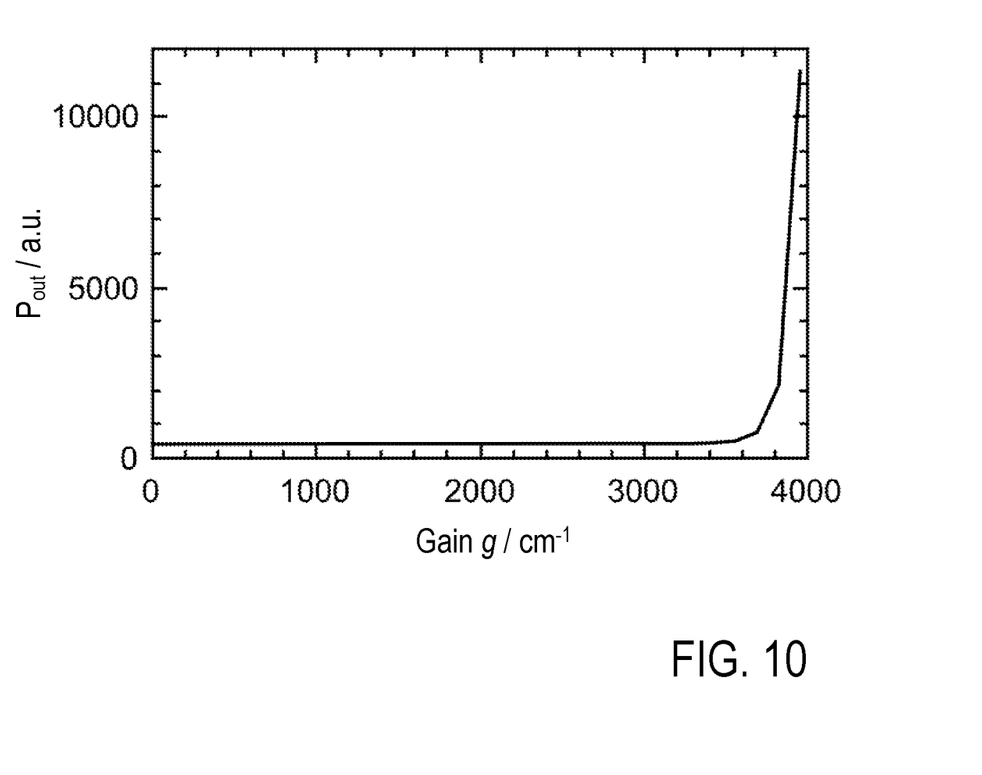

The simulation of the laser device 100 shown in FIG. 9 assumes an ideal resonator end mirror 14 (reflectivity almost 1) and a partially transmissive resonator coupling-out mirror 15 having a transmissivity T=0.35, based on a Bragg structure having 15 periods. In the semiconductor elements 21, light is generated by electrical excitation, and in interaction with the linear resonator 12 undergoes resonant feedback and is amplified in the semiconductor elements 21, resulting in the light becoming coherent. The function shown in FIG. 10 is obtained by calculating the light output power $P_{out}$ that exits through the coupling-out mirror 15 according to the gain g in the (In,Ga)As-based semiconductor elements 21.

In order to achieve laser emission from the linear resonator 12, the optical gain of the active material (photonic crystal 20) must be greater than the resonator losses. To achieve this, charge carriers are injected into the semiconductor elements 21 by the electrical excitation. For gain values greater than 3600 cm$^{-1}$, the output power rises exponentially. In order to attain this threshold value using the minimum possible pump currents (excitation currents), the resonator losses must be minimized, in particular by designing the coupling-out mirror 15 for a lower transmissivity, preferably of less than 5%.

The features of the invention disclosed in the above description, in the drawings and in the claims may be relevant, both individually and in combination or sub-combination, to realizing the invention in its various embodiments.

The invention claimed is:
1. A laser device, comprising:
a substrate, comprising a first surface;
a passive circular optical waveguide, comprising an unstructured surface and a second surface that is opposite to the unstructured surface, wherein the second surface is arranged on the first surface;
a photonic crystal, comprising active sections, arranged on the unstructured surface;
a coupling section, arranged adjacent to the waveguide for coupling out laser light;
wherein the photonic crystal comprises a plurality of semiconductor elements that include the active sections, said elements have at least one of a pillar-shape and a wall-shape and are arranged periodically around the perimeter of the waveguide, such that the photonic crystal does not extend into the waveguide;
wherein the waveguide and the photonic crystal together form a closed optical resonator, such that at least one resonator mode forms a standing wave in the resonator;
wherein the photonic crystal is configured for optical interaction with the at least one resonator mode for generation and/or amplification of laser light at a wavelength of the at least one resonator mode;
wherein the closed optical resonator is a ring resonator or a racetrack resonator, composed of straight and curved sections.
2. The laser device according to claim 1, wherein the photonic crystal is arranged on the unstructured surface of the optical waveguide, which surface runs parallel to the first surface of the substrate, and the semiconductor elements are oriented perpendicular to the first surface of the substrate.
3. The laser device according to claim 1, wherein the semiconductor elements are arranged in a periodic manner along the resonator at positions of field maxima of the at least one resonator mode.

4. The laser device according to claim 1, wherein the semiconductor elements form at least two rows, which extend along the resonator.

5. The laser device according to claim 1, wherein the substrate carries a contact electrode adjacent to the photonic crystal.

6. The laser device according to claim 1, wherein the semiconductor elements of the photonic crystal are arranged in a dielectric embedding layer.

7. The laser device according to claim 6, wherein the embedding layer carries an electrical contact layer.

8. The laser device according to claim 1, wherein
the optical waveguide comprises silicon, and
the substrate is a SOI substrate having a silicon support substrate, a silicon dioxide layer and a silicon cover layer, which contains the optical waveguide.

9. A method for operating a laser device according to claim 1, comprising the steps:
coupling the laser device to a pump device;
exciting the photonic crystal by the pump device; and
emitting laser light from the photonic crystal.

10. The method according to claim 9, wherein
the pump device comprises a pump current source, which excites the photonic crystal electrically.

11. The method according to claim 9, wherein
the pump device comprises a pump light source, which excites the photonic crystal optically.

12. A method for producing a laser device according to claim 1, comprising the steps:
providing the substrate with the optical waveguide; and
growing the semiconductor elements of the photonic crystal on the optical waveguide.

13. The method according to claim 12, comprising the step:
making contact to the photonic crystal with contact electrodes.

14. The method according to claim 12, wherein
the step of growing the semiconductor elements comprises at least one of direct epitaxial growth or vapor-liquid-solid based growth of the semiconductor elements on the optical waveguide, and mask-based deposition of the semiconductor elements on the optical waveguide.

15. The method according to claim 12, wherein
the semiconductor elements are embedded in a transparent embedding layer.

16. The laser device according to claim 7, wherein
the embedding layer carries an opaque contact layer.

* * * * *